(12) United States Patent
Xing et al.

(10) Patent No.: US 9,146,288 B2
(45) Date of Patent: Sep. 29, 2015

(54) BODY/HEAD COIL SWITCHING METHOD, A POWER AMPLIFIER COMPONENT AND A MRI SYSTEM

(71) Applicant: GE MEDICAL SYSTEMS GLOBAL TECHNOLOGY COMPANY, LLC, Waukesha, WI (US)

(72) Inventors: Haoyang Xing, Beijing (CN); Yu Liu, Beijing (CN); Anmou Liao, Beijing (CN); Kai Wang, Beijing (CN); Chenxing Zhao, Beijing (CN); Qibin Peng, Beijing (CN)

(73) Assignee: GE Medical Systems Global Technology Company, LLC, Waukesha, WI (US)

( * ) Notice: Subject to any disclaimer, the term of this patent is extended or adjusted under 35 U.S.C. 154(b) by 448 days.

(21) Appl. No.: 13/755,272

(22) Filed: Jan. 31, 2013

(65) Prior Publication Data

US 2013/0193965 A1  Aug. 1, 2013

(30) Foreign Application Priority Data

Jan. 31, 2012 (CN) .......................... 2012 1 0031465

(51) Int. Cl.
*G01V 3/00* (2006.01)
*G01R 33/36* (2006.01)
*G01R 33/341* (2006.01)

(52) U.S. Cl.
CPC .......... *G01R 33/3614* (2013.01); *G01R 33/341* (2013.01); *G01R 33/3664* (2013.01)

(58) Field of Classification Search
CPC .................................................. G01R 33/3664
USPC .................................................. 324/322, 318
See application file for complete search history.

(56) References Cited

U.S. PATENT DOCUMENTS

| 5,386,191 A * | 1/1995 | McCarten et al. ............ 324/318 |
| 6,177,797 B1 * | 1/2001 | Srinivasan .................... 324/318 |
| 2009/0091326 A1 * | 4/2009 | Fischer et al. ................ 324/322 |
| 2009/0201019 A1 * | 8/2009 | Zhai et al. ..................... 324/307 |

* cited by examiner

*Primary Examiner* — Louis Arana
(74) *Attorney, Agent, or Firm* — GE Global Patent Operation; Marc A. Vivenzio (57) ABSTRACT

A method for implementing a switching between a body coil and a head coil in a nuclear magnetic resonance imaging system comprising the body coil, the head coil and a power amplifier component, wherein the power amplifier component comprises sets of power amplifiers, each set of power amplifiers comprising channels of power amplifiers combined by a Wilkinson circuit, a combiner configured to combine signals from the sets of power amplifiers and to connect the sets of power amplifiers to the body coil, a first switching device comprising a first terminal configured to be grounded, a second switching device connected in series in a resistor branch of the Wilkinson circuit, and a ¼ wavelength transformation transmission line located between the second switching device and the head coil, the method comprising connecting the power amplifier component to the body coil or the head coil by setting states of both switching devices.

6 Claims, 5 Drawing Sheets

BODY/HEAD COIL SWITCHING METHOD, A POWER AMPLIFIER COMPONENT AND A MRI SYSTEM

BACKGROUND OF THE INVENTION

1. Field of the Invention

Embodiments of the present invention generally relate to the field of nuclear magnetic resonance and, more specifically, to the body/head coil switching in nuclear magnetic resonance.

2. Description of the Prior Art

Currently, nuclear magnetic resonance technologies find wide application in the medical arts. Magnetic Resonance Imaging (MRI), also referred to as Nuclear Magnetic Resonance Imaging (NMRI), is a diagnosis method that generates an image with the use of resonance of atomic nucleuses in a magnetic field. Its basic principle is that an image is constituted by using inherent characteristics of atomic nucleuses and interaction of magnetic fields. A class of atomic nucleuses that are closely related to body tissues will generate a magnetic resonance signal under the action of an external radio frequency (RF) field, and a set of parameters related to the magnetic resonance may be used as variables for imaging.

A RF coil is an important part of a MRI system, and all of magnetic resonance scans and examinations will be done with the use of the coil. Its function is to transmit RF pulses and receive MRI signals, and is an important link in MRI system imaging. A RF coil may be classified into a head coil, a body coil, and the like, depending on its structure and the purpose of the examination. In practice, depending on the part to be examined, the size of lesion and the purpose of the examination, switching is required among different RF coils, thereby improving the image quality of the MRI examination, improving the diagnostic coincidence rate of the MRI examination, and enlarging the application range of the MRI examination.

In a magnetic resonance imaging apparatus, a power amplifier (PA) is one of its important components. A PA consumes power of a power supply, and outputs RF power. RF PA will output different power levels when it is connected with a body coil and a head coil, respectively. For existing MR PA designs, there are two methods to implement this. The first PA design is to use a six-way parallel connection to meet the requirement of a body coil, and switch to a head coil when it is connected with some other coils. However, a disadvantage with this method is that the efficiency is low when it is connected with a head coil. The second PA design is to use a sicx-channel parallel connection to meet the requirement of a body coil, and design another separate channel for connecting to a head coil. However, a disadvantage with this method is that it is expensive.

Therefore, there is a need for a novel PA design that can improve the efficiency while reducing the cost.

BRIEF SUMMARY OF THE INVENTION

According to an embodiment of the present invention, there is provided a method for implementing a switching between a body coil and a head coil in a nuclear magnetic resonance imaging system. The nuclear magnetic resonance imaging system comprises the body coil, the head coil and a power amplifier component, wherein the power amplifier component comprises a plurality of sets of power amplifiers, each set of power amplifiers comprising a plurality of channels of power amplifiers combined by a Wilkinson circuit, a combiner configured to combine signals from the plurality of sets of power amplifiers and to connect the plurality of sets of power amplifiers to the body coil, a first switching device comprising a first terminal configured to be grounded, a second switching device connected in series in a resistor branch of the Wilkinson circuit, and a ¼ wavelength transformation transmission line located between the second switching device and the head coil. The method comprises connecting the power amplifier component to the body coil or the head coil by setting states of both the first switching device and the second switching device.

According to an embodiment of the present invention, there is provided a power amplifier component for use in a nuclear magnetic resonance imaging system. The nuclear magnetic resonance imaging system comprises a body coil, a head coil and the power amplifier component, the power amplifier component comprises a plurality of sets of power amplifiers, each set of power amplifiers comprising a plurality of channels of power amplifiers combined by a Wilkinson circuit, a combiner configured to combine signals from the plurality of sets of power amplifiers and to connect the plurality of sets of power amplifiers to the body coil, a first switching device comprising a first terminal configured to be grounded, a second switching device connected in series in a resistor branch of the Wilkinson circuit, and a ¼ wavelength transformation transmission line located between the second switching device and the head coil, wherein the power amplifier component is connected to the body coil or the head coil by setting states of both the first switching device and the second switching device.

According to an embodiment of the present invention, there is provided a nuclear magnetic resonance imaging system. The nuclear magnetic resonance imaging system comprises a body coil, a head coil, and a power amplifier component. The power amplifier component comprises a plurality of sets of power amplifiers, each set of power amplifiers comprising a plurality of channels of power amplifiers combined by a Wilkinson circuit, a combiner configured to combine signals from the plurality of sets of power amplifiers and to connect the plurality of sets of power amplifiers to the body coil, a first switching device comprising a first terminal configured to be grounded, a second switching device connected in series in a resistor branch of the Wilkinson circuit, and a ¼ wavelength transformation transmission line located between the second switching device and the head coil, wherein the power amplifier component is connected to the body coil or the head coil by setting states of both the first switching device and the second switching device.

BRIEF DESCRIPTION OF THE DRAWINGS

The foregoing and other objects and features will be apparent from the following description in conjunction with accompanying drawings, in which.

The same reference numbers have been used throughout these figures to denote the same or similar parts.

DETAILED DESCRIPTION OF EXEMPLARY EMBODIMENTS OF THE INVENTION

The present invention will be further explained below in conjunction with the accompanying drawings and specific embodiments. In the following description, technical features necessary for implementing the present invention are mainly given, and some technical features well known to those skilled in the art are omitted for the purpose of clarity.

Throughout the figures, TL1-TL12 denote ¼ wavelength transmission lines, TP1-TP3 denote connection points, and Tee1-Tee3 denote microstrip lines for connection; at the connection of microstrip lines for different branches, R1-R3 denote resistors, and freq denotes a frequency.

Figure 1:
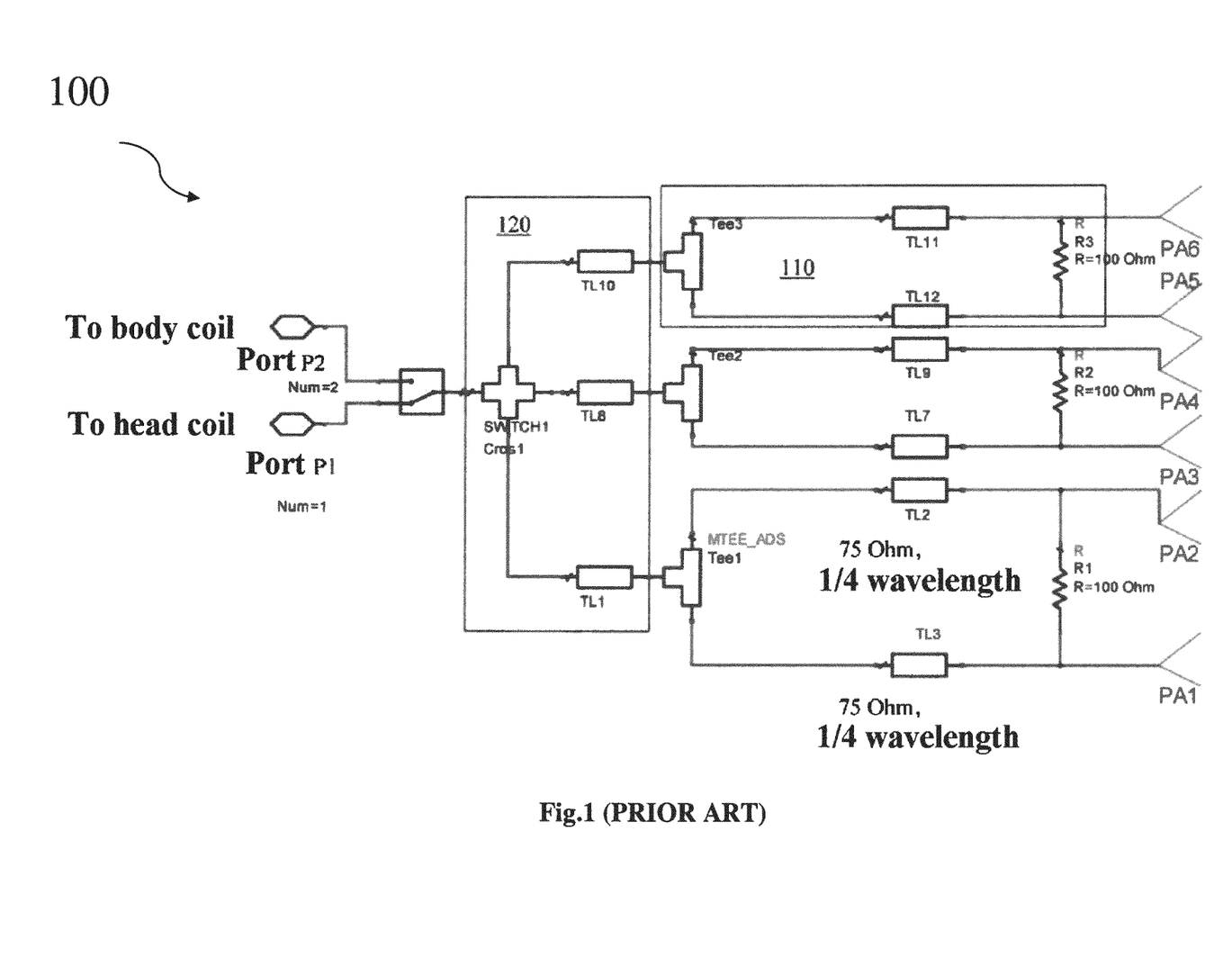
FIG. 1 is a schematic circuit diagram of an existing PA design.

FIG. 1 is a schematic circuit diagram of an existing PA design 100.

In FIG. 1, two channels of PAs (e.g., PA5 and PA6) are combined by a 2-in-1 Wilkinson circuit 110, three sets of such two-channel PAs (e.g., PA1 and PA2, PA3 and PA4, PA5 and PA6) are combined by a 3-in-1 combiner 120. Thus, up to six channels of PAs are connected in parallel in order to meet the system requirement. This design corresponds to the first method described in the Background, which utilizes a six-channel parallel connection to meet the requirement of a body coil, and switches to a head coil when it is connected to some other coils. A disadvantage with this method is that the efficiency is low when it is connected with a head coil.

Figure 2:
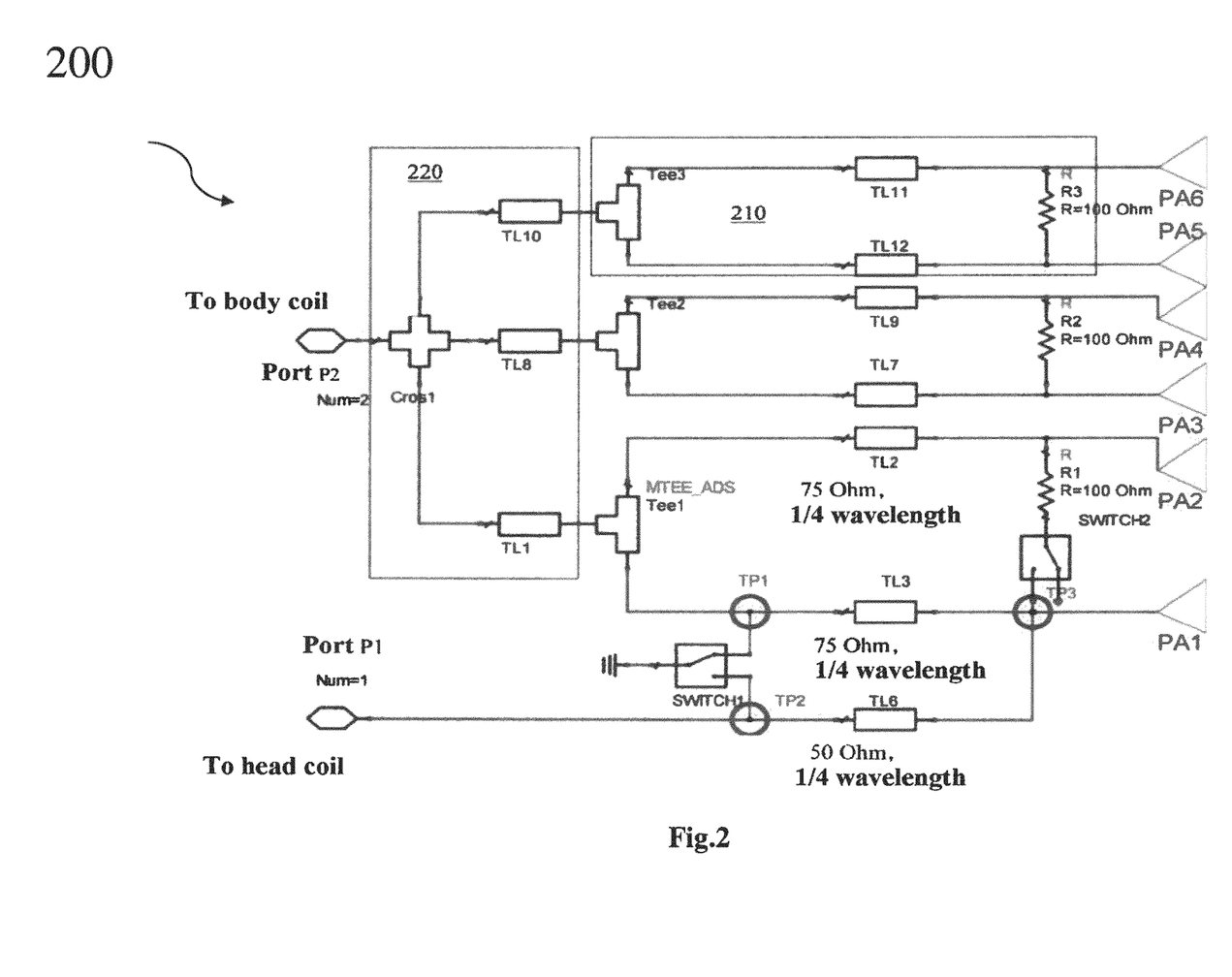
FIG. 2 is a schematic circuit diagram of a PA design according to an embodiment of the present invention.

FIG. 2 is a schematic diagram of a PA design 200 according to an embodiment of the present invention. Two SPDT (single pole double throw) switches SWITCH1 and SWITCH2 and a ¼ wavelength transmission line TL6 are introduced in the PA design 200 of FIG. 2 on the basis of the PA design 100 of FIG. 1.

The nuclear magnetic resonance imaging system includes a body coil, a head coil and a PA component 200. It should be noted that the nuclear magnetic resonance imaging system also includes some other components, but only those components necessary for implementing the present invention are described here.

The PA component 200 may include three sets of PAs, each set of PAs comprising two channels of PAs combined by a 2-in-1 Wilkinson circuit 220. It should be noted that the three sets of PAs shown in FIG. 2 are illustrative, and an actual PA component may have a different number of sets of PAs as needed. Furthermore, the 2-in-1 Wilkinson circuit 220 shown in FIG. 2 is also illustrative, and an actual Wilkinson circuit 220 may combine a different number of channels of PAs as needed.

The PA component 200 may further include a combiner 210 for combining signals from these three sets of PAs and connecting them to a body coil.

The PA component 200 may further include a first switching device SWITCH1, one terminal of which may be grounded, as shown in FIG. 2.

The PA component 200 may further include a second switching device SWITCH2, which may be connected in series in a resistor branch of a Wilkinson circuit 220, as shown in FIG. 2.

The PA component 200 may further include a ¼ wavelength transmission line TL6, which may be located between the second switching device SWITCH2 and the head coil, as shown in FIG. 2.

The switching method according to an embodiment of the present invention may include connecting the PA component 200 to the body coil or the head coil by setting states of the first switching device SWITCH1 and the second switching device SWITCH2.

Firstly, the operating state of the body coil of FIG. 2 will be described. When states of both the SPDT switching device SWITCH1 and SWITCH2 are set to "1", which means TP2 is grounded, SWITCH2 is connected with TP3. Since TP2 is grounded, Term4 (see e.g., FIG. 3) will be a theoretically open circuit with a ¼ wavelength transformation when seen from TP3. At this time, the PA design 200 of FIG. 2 operates in a manner similar to the PA design 100 of FIG. 1. The signal flows from PA into Term1 (see e.g., FIG. 3) and is used for the body coil.

Secondly, the operating state of the head coil of FIG. 2 will be described. When states of both the SPDT switching device SWITCH1 and SWITCH2 are set to "0", which means TP1 is grounded, SWITCH2 is connected to a open circuit, and TP3 is disconnected from the balancing resistor R1 of 100 ohms. Since TP1 is grounded, Term1 will be an theoretically open circuit with a ¼ wavelength transformation when seen from TP3, which means TP3 is only connected with Term4 through the ¼ wavelength transformation transmission line. Therefore, the signal flows from PA into Term4 (see e.g., FIG. 3) and is used for the head coil.

Since SWITCH1 is grounded only through the ¼ wavelength transformation transmission line, theoretically no power will flow into it, while SWITCH2 is only connected to a open circuit and the balancing resistor R1. Therefore, based on the above analysis, only a small amount of power will flow into it. Therefore, with respect to the first existing PA designed described in the Background, embodiments of the the present invention may save the cost by employing a RF switch with small power, and with respect to the second existing PA design described in the Background, embodiments of the present invention may only use one-channel PA in order to meet the requirement of the head coil, thereby saving the cost of one channel of PA.

Figure 3:
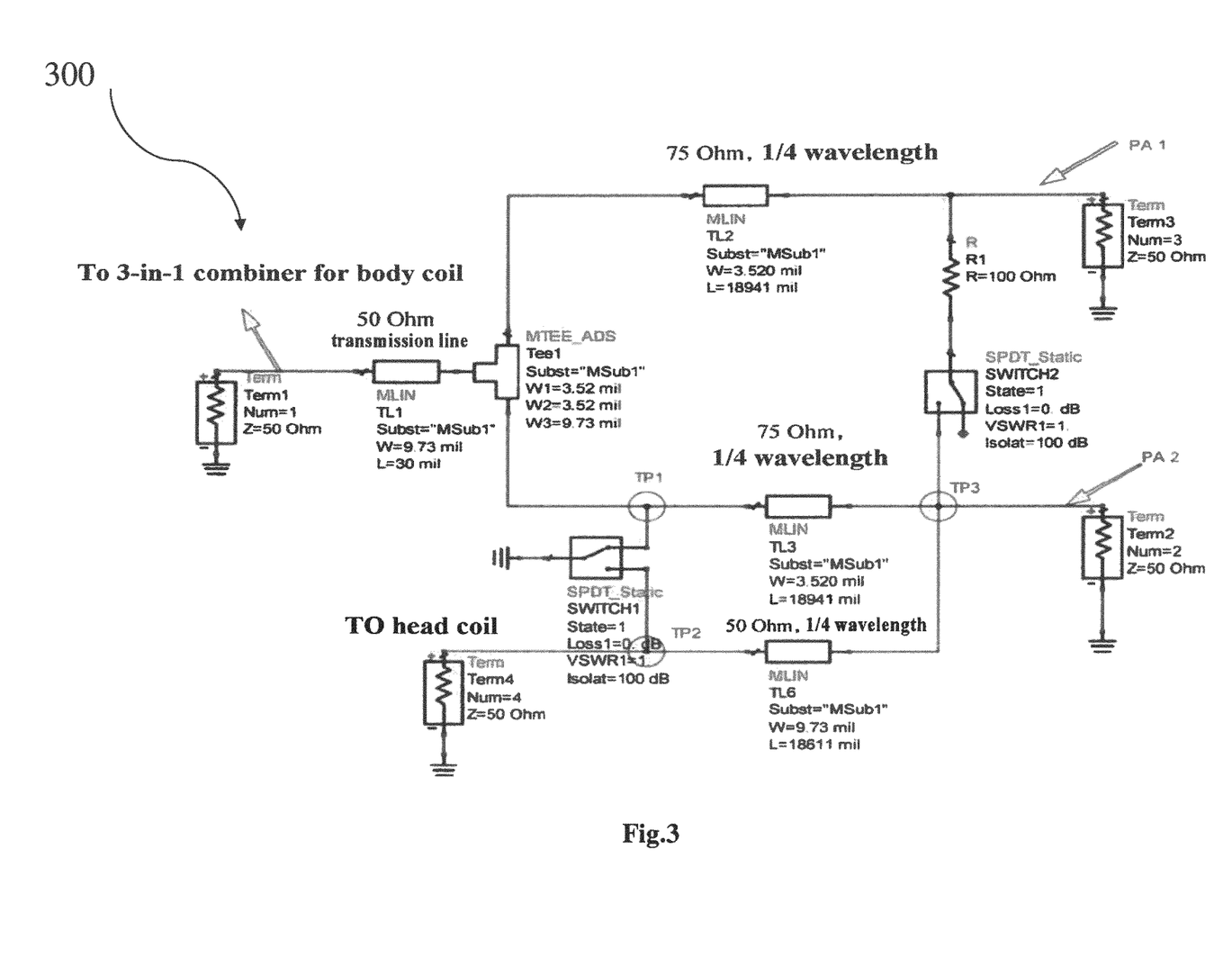
FIG. 3 is a schematic circuit diagram of a simulation circuit for simulating the PA design of FIG. 2 according to an embodiment of the present invention.

FIG. 3 is a schematic circuit diagram of the simulation circuit 300 for simulating the PA design 200 of FIG. 2, which is directed to a PA design with MR 1.5T field intensity, and thus the center frequency thereof is 63.86 Mhz.

It should be noted that both FIG. 2 and FIG. 3 are illustrative. In other embodiments, the above two SPDT switch SWITCH1 and SWITCH2 and a ¼ wavelength transmission line TL6 may be connected to any one of three Wilkinsons, not limited to the manner of the connection shown in the figures.

Figure 4:
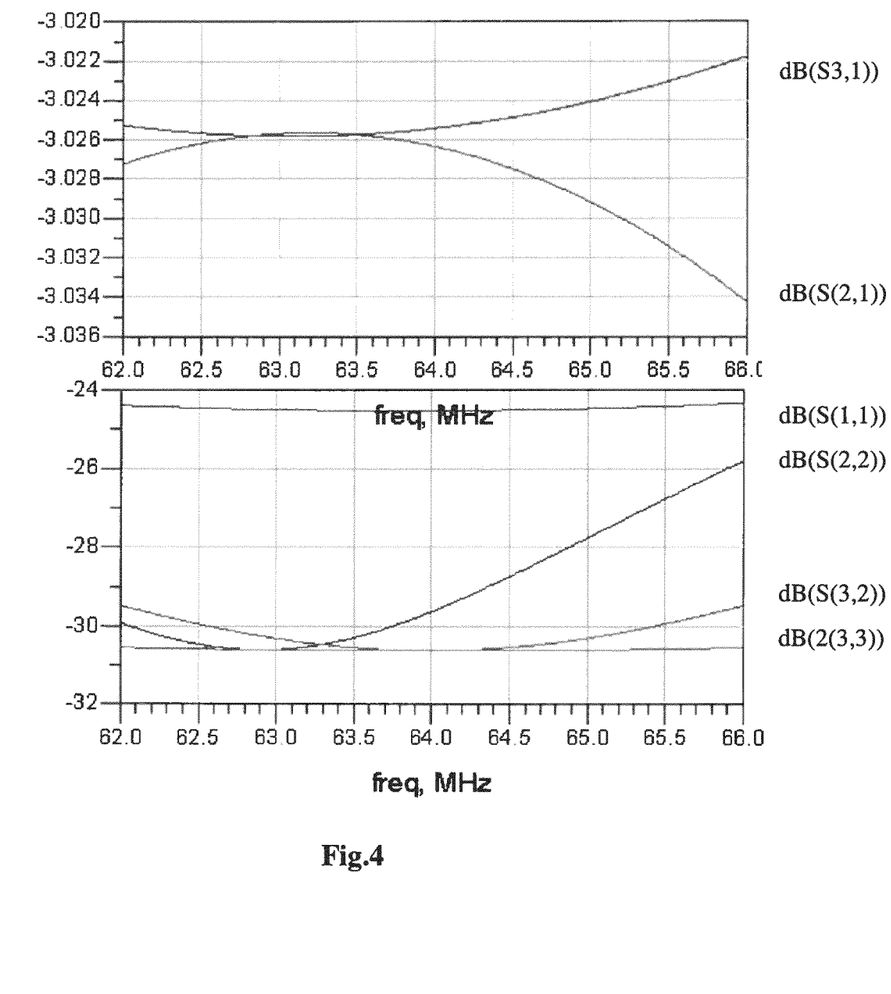
FIG. 4 is simulation results generated by the simulation circuit of FIG. 3 for the body mode according to an embodiment of the present invention.
Figure 5:
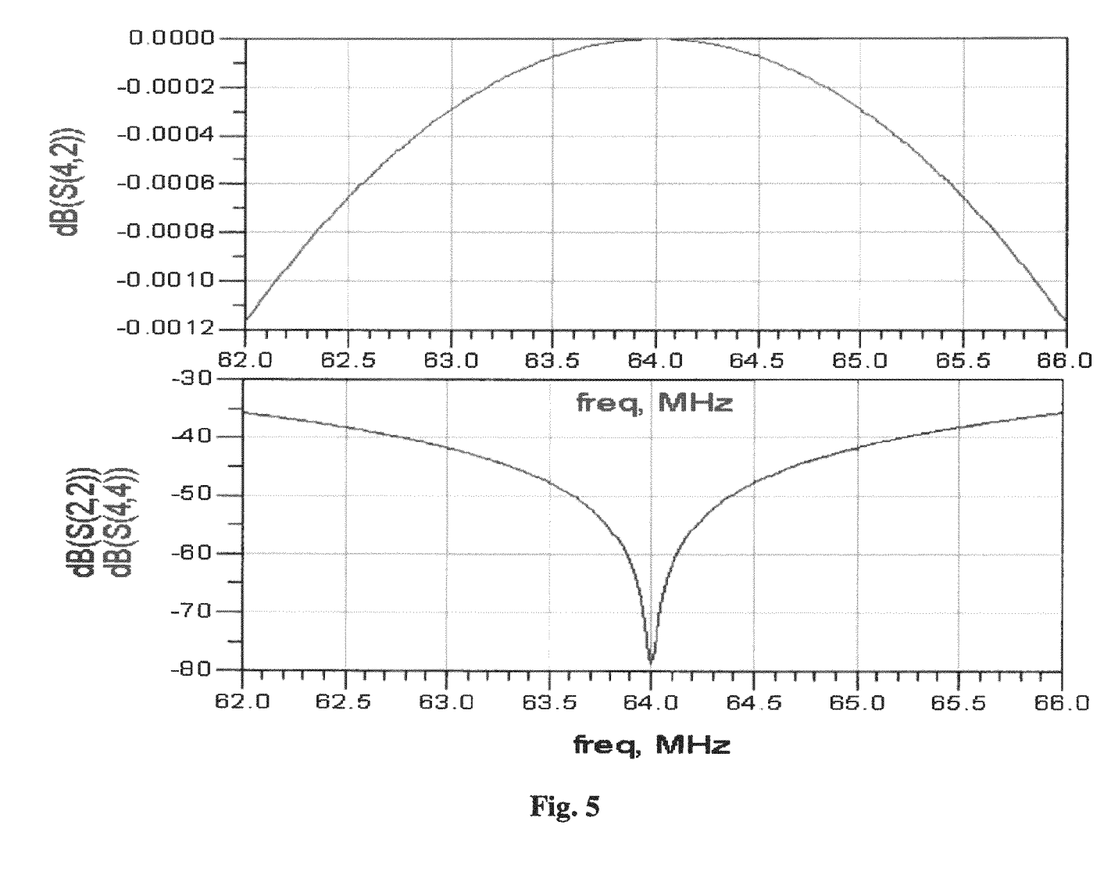
FIG. 5 is simulation results generated by the simulation circuit of FIG. 3 for the head mode according to an embodiment of the present invention.

FIG. 4 is simulation results generated by the simulation circuit of FIG. 3 for the body mode, and FIG. 5 is simulation results generated by the simulation circuit of FIG. 3 for the head mode. It may be seen from simulation results shown in FIGS. 4 and 5, since a ¼ wavelength transmission line TL6 is introduced in the PA design according to embodiments of the present invention, the embodiments of the present invention can substantially improve the power efficiency while saving the cost, compared to the existing PA designs.

In order to achieve the above objects, embodiments of the present invention provide a method for implementing the switching between a body coil and a head coil in a nuclear magnetic resonance imaging system, wherein the nuclear magnetic resonance imaging system includes a body coil, a head coil and a power amplifier, and wherein the power amplifier component includes a plurality of sets of power amplifiers, each set of power amplifiers comprising a plurality of channels of power amplifiers combined by Wilkinson circuit, a combiner for combining signals from the plurality of sets of power amplifiers and connecting them to the body coil, a first switching device, one terminal of which being grounded, a second switching device, connected in series in a resistor branch of a Wilkinson circuit, and a ¼ wavelength transmission line, located between the second switching device and the head coil, the method includes the steps of connecting the power amplifier component to the body coil or the head coil by setting states of the first switching device and the second switching device.

An embodiment of the present invention provides a power amplifier component for use in a nuclear magnetic resonance imaging system, wherein the nuclear magnetic resonance imaging system includes a body coil, a head coil and the power amplifier component, the power amplifier component includes a plurality of sets of power amplifiers, each set of power amplifiers comprising a plurality of channels of power amplifiers combined by Wilkinson circuit, a combiner for combining signals from the plurality of sets of power amplifiers and connecting them to the body coil, a first switching device, one terminal of which being grounded, a second switching device, connected in series in a resistor branch of a Wilkinson circuit, and a ¼ wavelength transmission line, located between the second switching device and the head coil, wherein the power amplifier component is connected to the body coil or the head coil by setting states of the first switching device and the second switching device.

An embodiment of the present invention provides a nuclear magnetic resonance imaging system comprising the above power amplifier component.

According to embodiments of the present invention, the power efficiency can be substantially improved while the cost can be saved.

It should be noted that the embodiments described above are merely illustrative rather than limiting, and those skilled in the art may design many alternative embodiments without departing from the scope of the appended claims. The verbs "include" or "comprise" used herein does not exclude the elements and steps other than the elements and steps set forth in the claims or the description. The word "a" or "an" preceding an element does not exclude the presence of a plurality of such elements; In the claims, any reference numbers placed between parentheses should not be construed as limiting the claim.

What is claimed is:

1. A method for implementing a switching between a body coil and a head coil in a nuclear magnetic resonance imaging system, wherein the nuclear magnetic resonance imaging system comprises the body coil, the head coil and a power amplifier component, wherein the power amplifier component comprises:
    a plurality of sets of power amplifiers, each set of power amplifiers comprising a plurality of channels of power amplifiers combined by a Wilkinson circuit;
    a combiner configured to combine signals from the plurality of sets of power amplifiers and to connect the plurality of sets of power amplifiers to the body coil;
    a first switching device comprising a first terminal configured to be grounded;
    a second switching device connected in series in a resistor branch of the Wilkinson circuit; and
    a ¼ wavelength transformation transmission line located between the second switching device and the head coil,
    the method comprising:
    connecting the power amplifier component to the body coil or the head coil by setting states of both the first switching device and the second switching device.

2. The method according to claim 1, wherein the setting states comprises a first state and a second state,
    wherein when the first switching device and the second switching device are set to the first state, the power amplifier component is connected to the body coil, the first switching device is connected to the head coil and the ¼ wavelength transformation transmission line, so that the head coil and the ¼ wavelength transformation transmission line are grounded, and a resistor in the resistor branch of the second switching device is connected to the Wilkinson circuit, and
    wherein when the first switching device and the second switching device are set to the second state, the power amplifier component is connected to the head coil, the first switching device is connected to a second terminal of a power amplifier branch of the second switching device, so that the second terminal is grounded, the second switching device is open, and the resistor in the resistor branch is open.

3. A power amplifier component for use in a nuclear magnetic resonance imaging system, wherein the nuclear magnetic resonance imaging system comprises a body coil, a head coil and the power amplifier component, the power amplifier component comprises:
    a plurality of sets of power amplifiers, each set of power amplifiers comprising a plurality of channels of power amplifiers combined by a Wilkinson circuit;
    a combiner configured to combine signals from the plurality of sets of power amplifiers and to connect the plurality of sets of power amplifiers to the body coil;
    a first switching device comprising a first terminal configured to be grounded;
    a second switching device connected in series in a resistor branch of the Wilkinson circuit; and
    a ¼ wavelength transformation transmission line located between the second switching device and the head coil,
    wherein the power amplifier component is connected to the body coil or the head coil by setting states of both the first switching device and the second switching device.

4. The power amplifier component according to claim 3, wherein the setting states comprises a first state and a second state,
    wherein when the first switching device and the second switching device are set to the first state, the power amplifier component is connected to the body coil, the first switching device is connected to the head coil and the ¼ wavelength transformation transmission line, so that the head coil and the ¼ wavelength transformation transmission line are grounded, and a resistor in the resistor branch of the second switching device is connected to the Wilkinson circuit; and
    wherein when the first switching device and the second switching device are set to the second state, the power amplifier component is connected to the head coil, the first switching device is connected with a second terminal of a power amplifier branch of the second switching device, so that the second terminal is grounded, the second switching device is open, and the resistor in the resistor branch is open.

5. A nuclear magnetic resonance imaging system, comprising:
    a body coil;
    a head coil; and
    a power amplifier component comprising:
        a plurality of sets of power amplifiers, each set of power amplifiers comprising a plurality of channels of power amplifiers combined by a Wilkinson circuit;

a combiner configured to combine signals from the plurality of sets of power amplifiers and to connect the plurality of sets of power amplifiers to the body coil;

a first switching device comprising a first terminal configured to be grounded;

a second switching device connected in series in a resistor branch of the Wilkinson circuit; and a ¼ wavelength transformation transmission line located between the second switching device and the head coil, wherein the power amplifier component is connected to the body coil or the head coil by setting states of both the first switching device and the second switching device.

6. The nuclear magnetic resonance imaging system according to claim 5, wherein the setting states comprises a first state and a second state, wherein when the first switching device and the second switching device are set to the first state, the power amplifier component is connected to the body coil, the first switching device is connected to the head coil and the ¼ wavelength transformation transmission line, so that the head coil and the ¼ wavelength transformation transmission line are grounded, and a resistor in the resistor branch of the second switching device is connected to the Wilkinson circuit; and wherein when the first switching device and the second switching device are set to the second state, the power amplifier component is connected to the head coil, the first switching device is connected with a second terminal of a power amplifier branch of the second switching device, so that the second terminal is grounded, the second switching device is open, and the resistor in the resistor branch is open.

* * * * *

UNITED STATES PATENT AND TRADEMARK OFFICE
CERTIFICATE OF CORRECTION

Page 1 of 1

PATENT NO. : 9,146,288 B2
APPLICATION NO. : 13/755272
DATED : September 29, 2015
INVENTOR(S) : Xing et al.

It is certified that error appears in the above-identified patent and that said Letters Patent is hereby corrected as shown below:

In the specification

In Column 1, Line 49, delete "sicx-channel" and insert -- six-channel --, therefor.

In Column 5, Line 40, delete "elements;" and insert -- elements. --, therefor.

Signed and Sealed this
Fifth Day of April, 2016

Michelle K. Lee
*Director of the United States Patent and Trademark Office*